United States Patent
Roh et al.

(10) Patent No.: US 10,388,701 B2
(45) Date of Patent: Aug. 20, 2019

(54) STACKED IMAGE SENSOR AND METHOD OF MANUFACTURING THE SAME

(71) Applicant: SAMSUNG ELECTRONICS CO., LTD., Suwon-si (KR)

(72) Inventors: Sookyoung Roh, Seoul (KR); Seokho Yun, Hwaseong-si (KR); Sunghyun Nam, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 18 days.

(21) Appl. No.: 15/241,660

(22) Filed: Aug. 19, 2016

(65) Prior Publication Data

US 2017/0053969 A1    Feb. 23, 2017

(30) Foreign Application Priority Data

Aug. 19, 2015    (KR) .................. 10-2015-0116852

(51) Int. Cl.
| | |
|---|---|
| *H01L 27/146* | (2006.01) |
| *H01L 27/30* | (2006.01) |
| *H01L 31/028* | (2006.01) |
| *H01L 51/44* | (2006.01) |
| H01L 31/0256 | (2006.01) |

(52) U.S. Cl.
CPC ...... *H01L 27/307* (2013.01); *H01L 27/14621* (2013.01); *H01L 27/14627* (2013.01); *H01L 31/028* (2013.01); *H01L 51/44* (2013.01); H01L 2031/0344 (2013.01)

(58) Field of Classification Search
CPC .................................................. H01L 27/307
USPC .......... 257/E27.135, E31.127, 440; 384/294
See application file for complete search history.

(56) References Cited

U.S. PATENT DOCUMENTS

| | | | |
|---|---|---|---|
| 7,521,658 B2 | 4/2009 | Matthews | |
| 8,035,708 B2 | 10/2011 | Takizawa et al. | |
| 10,178,332 B2 * | 1/2019 | Hatano | .................... G02B 7/34 |
| 2002/0058353 A1 | 5/2002 | Merrill | |
| 2008/0135897 A1 * | 6/2008 | Huang | .............. H01L 27/14621 257/292 |
| 2008/0246853 A1 * | 10/2008 | Takizawa | .......... H01L 27/14621 348/222.1 |
| 2013/0001724 A1 * | 1/2013 | Masuda | ............ H01L 27/14623 257/432 |
| 2013/0033268 A1 * | 2/2013 | Parkhou | .................. F03D 11/00 324/511 |
| 2013/0033628 A1 * | 2/2013 | Yamaguchi | ........ H01L 27/14632 348/294 |

(Continued)

FOREIGN PATENT DOCUMENTS

| | | |
|---|---|---|
| JP | 2008-258474 A | 10/2008 |
| KR | 10-2011-0093453 A | 3/2011 |

(Continued)

*Primary Examiner* — Victoria K. Hall
(74) *Attorney, Agent, or Firm* — Sughrue Mion, PLLC (57) ABSTRACT

A stacked image sensor and a method of manufacturing the same are provided. The stacked image sensor includes a lower photoelectric conversion layer, a micro-lens provided on the lower photoelectric conversion layer, and an upper photoelectric conversion layer provided on the micro-lens. The lower photoelectric conversion layer and the upper photoelectric conversion layer are different types of photoelectric conversion layers.

17 Claims, 10 Drawing Sheets

(56) References Cited

U.S. PATENT DOCUMENTS

| | | | |
|---|---|---|---|
| 2014/0077324 A1* | 3/2014 | Matsugai | H01L 27/14618 257/432 |
| 2014/0160327 A1* | 6/2014 | Enoki | H01L 27/307 348/294 |
| 2014/0353651 A1* | 12/2014 | Takimoto | H01L 51/448 257/40 |
| 2015/0364521 A1 | 12/2015 | Nam et al. | |
| 2017/0257587 A1* | 9/2017 | Hatano | G02B 7/34 |
| 2018/0213170 A1* | 7/2018 | Segawa | H01L 27/307 |
| 2018/0342558 A1* | 11/2018 | Hirata | H01L 27/307 |
| 2018/0342683 A1* | 11/2018 | Negishi | C09B 47/00 |
| 2018/0350881 A1* | 12/2018 | Nakayama | H01L 27/286 |

FOREIGN PATENT DOCUMENTS

| | | |
|---|---|---|
| KR | 10-2014-0074204 A | 6/2014 |
| KR | 10-2015-0143147 A | 12/2015 |

\* cited by examiner

STACKED IMAGE SENSOR AND METHOD OF MANUFACTURING THE SAME

CROSS-REFERENCE TO RELATED APPLICATION

This application claims priority from Korean Patent Application No. 10-2015-0116852, filed on Aug. 19, 2015 in the Korean Intellectual Property Office, the disclosure of which is incorporated by reference herein in its entirety.

BACKGROUND

1. Field

Apparatuses and methods consistent with the present disclosure relate to image sensors, and more particularly, to stacked image sensors and methods of manufacturing the same.

2. Description of the Related Art

Color filters are used to realize colors on an image sensor or a display device. The image sensor may be based on a charge coupled device (CCD) or a complementary metal oxide semiconductor (CMOS). The color filter transmits light of desired components (for example, red, blue, and green light) and absorbs remaining components. Accordingly, based on a unit pixel, a large portion, for example, two-thirds, of optical energy incident to a color filter is lost.

A color filter may also include a Bayer pattern, and an image in a color mosaic pattern may be obtained through the Bayer pattern. An image obtained in this manner may be restored to an original color image through image processing. However, in obtaining an image in a color mosaic pattern on a single plane loses a large portion of incident light due to the optical absorption by the color filter, and thus, there is a limit in efficiently using optical energy incident to an image sensor. Various methods have been proposed to overcome the above limitation, for example, a method of combining a color splitter with an image sensor or a method of using a stacked silicon photodiode.

SUMMARY

One or more exemplary embodiments provide stacked image sensors that increase energy efficiency of incident light.

Further, one or more exemplary embodiments provide stacked image sensors that increase the degree of color purity.

Further still, one or more exemplary embodiments provide methods of manufacturing the image sensors.

According to an aspect of an exemplary embodiment, there is provided a stacked image sensor including a lower photoelectric conversion layer; a micro-lens provided on the lower photoelectric conversion layer; and an upper photoelectric conversion layer provided on the micro-lens, wherein the lower photoelectric conversion layer and the upper photoelectric conversion layer are different types of photoelectric conversion layers.

The stacked image sensor may further include a color filter.

The lower photoelectric conversion layer may include only one photoelectric conversion layer in each of a plurality of color regions included in a unit pixel of the stacked image sensor.

The lower photoelectric conversion layer may include two vertically stacked photoelectric conversion layers for each of a plurality of color regions included in a unit pixel of the stacked image sensor.

The upper photoelectric conversion layer may be a flat type photoelectric conversion layer.

The upper photoelectric conversion layer may be a curved surface type photoelectric conversion layer.

The stacked image sensor may further include a transparent material layer provided between the upper photoelectric conversion layer and the micro-lens, the transparent material layer having a low optical absorption rate.

The upper photoelectric conversion layer may be a non-silicon-based photoelectric conversion layer and the lower photoelectric conversion layer may be a silicon-based photoelectric conversion layer.

The upper photoelectric conversion layer may include an organic photodiode.

The upper photoelectric conversion layer may be a photoelectric conversion layer that performs photoelectric conversion by absorbing green light.

The color filter may be an organic dye type color filter that absorbs a same color of light as the upper photoelectric conversion layer.

The two vertically stacked photoelectric conversion layers may have different thicknesses from each other.

According to an aspect of another exemplary embodiment, there is provided a method of manufacturing a stacked image sensor, the method including forming a lower photoelectric conversion layer in a silicon layer; forming a micro-lens on the silicon layer; and forming an upper photoelectric conversion layer on the micro-lens.

The upper photoelectric conversion layer may be formed by using a different method than a method used to form the lower photoelectric conversion layer.

The forming of the lower photoelectric conversion layer may include forming only one photoelectric conversion layer in each of a plurality of color regions included in a unit pixel of the stacked image sensor.

The forming of the lower photoelectric conversion layer may include forming two vertically stacked photoelectric conversion layers in each of a plurality of color regions included in a unit pixel of the stacked image sensor.

The upper photoelectric conversion layer may be a flat type photoelectric conversion layer or a curved surface type photoelectric conversion layer.

The lower photoelectric conversion layer may be a silicon-based photoelectric conversion layer and the upper photoelectric conversion layer may be a non-silicon-based photoelectric conversion layer.

The method may further include forming a color filter between the lower photoelectric conversion layer and the micro-lens.

The upper photoelectric conversion layer may comprise an organic photodiode.

According to an aspect of another exemplary embodiment, there is provided a stacked image sensor including, for each color region of a plurality of color regions of a pixel of the stacked image sensor: at least one silicon-based photoelectric conversion layer; a micro-lens disposed on the at least one silicon-based photoelectric conversion layer; and an organic photoelectric conversion layer disposed on the micro-lens.

The stacked image sensor may further include a color filter disposed between the micro-lens and the organic photoelectric conversion layer.

The at least one silicon-based photoelectric conversion layer may include only one silicon-based photoelectric conversion layer for each color region.

The at least one silicon-based photoelectric conversion layer may include two vertically stacked silicon-based photoelectric conversion layers for each color region.

The organic photoelectric conversion layer may have an upper surface that is flat.

The organic photoelectric conversion layer may have a curved surface.

The stacked image sensor may further include a transparent material layer provided between the organic photoelectric conversion layer and the micro-lens, the transparent material layer having a low optical absorption rate.

The color filter may be an organic dye color filter that absorbs a same color of light as the organic photoelectric conversion layer.

The two vertically stacked photoelectric conversion layers may have different thicknesses from each other.

BRIEF DESCRIPTION OF THE DRAWINGS

The above and/or other aspects will become apparent and more readily appreciated from the following description of exemplary embodiments, taken in conjunction with the accompanying drawings in which.

DETAILED DESCRIPTION

A description of stacked image sensors and methods of manufacturing the stacked image sensors according to exemplary embodiments will now be made in detail with reference to the accompanying drawings. In the drawings, the thicknesses of layers and regions are exaggerated for clarity.

As a kind of color filter, an organic dye type color filter may be used. The organic dye type color filter transmits light of desired components (for example, red, blue, and green light) and absorbs remaining components. Accordingly, based on a unit pixel, a large portion, for example, two-thirds, of optical energy incident to an organic dye type color filter is lost.

In an organic dye type color filter included in a color image sensor, a red region, a green region, and a blue region may include the Bayer pattern. This manner that obtains an image in a color mosaic pattern on a single plane loses a large portion of incident light due to the optical absorption by the color filter, and thus, there is a limit in efficiently using optical energy incident to an image sensor. Exemplary embodiments address these disadvantages of low efficiency in using optical energy incident to an image sensor.

First, a stacked image sensor according to an exemplary embodiment will be described.

Figure 1:
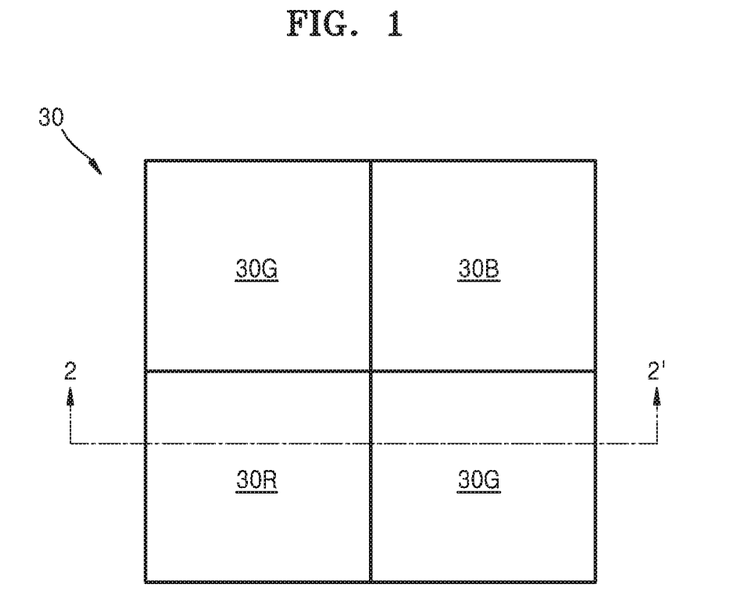
FIG. 1 is a plan view of a pixel of a stacked image sensor, according to an exemplary embodiment.

FIG. 1 is a plan view of a pixel 30 of a stacked image sensor according to an exemplary embodiment.

Referring to FIG. 1, the pixel 30 is a unit pixel that includes a red light R region 30R, a blue light B region 30B, and two green light G regions 30G. The four regions 30B, 30G, and 30R may constitute a Bayer pattern. It will be understood that, in some exemplary embodiments, the number of regions and their assigned colors may be changed from that shown in FIG. 1.

Figure 2:
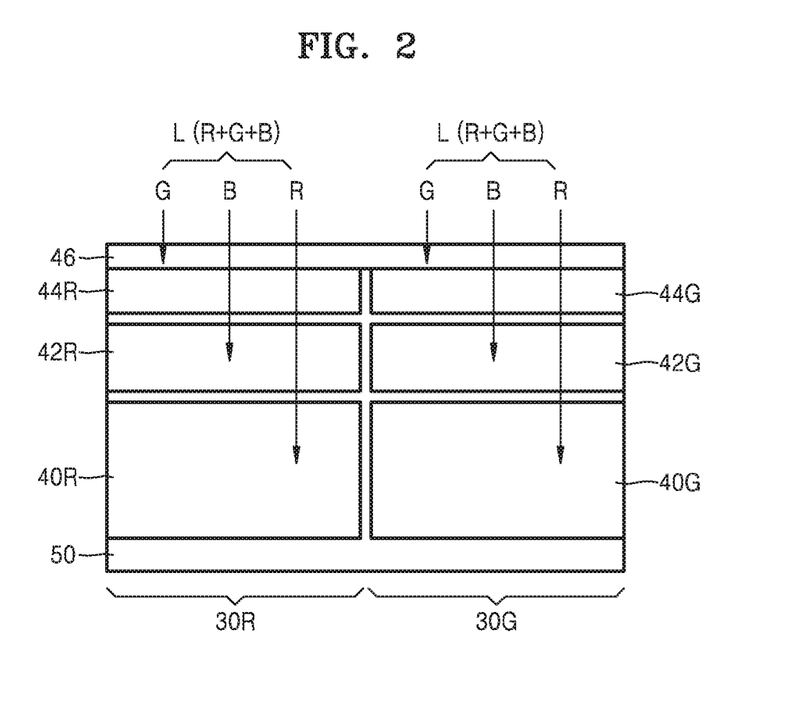
FIG. 2 is a cross-sectional view taken a line 2-2' of FIG. 1.

FIG. 2 shows an example of a cross-sectional view taken a line 2-2' of FIG. 1.

Referring to FIG. 2, a silicon layer 50 includes the red light region 30R and the green light regions 30G. The component of light L(R+G+B) incident to the red light region 30R and the component of light L(R+G+B) incident to the green light region 30G may not be the same. First photoelectric conversion layer 40R and second photoelectric conversion layer 42R are sequentially deposited in the red light region 30R of the silicon layer 50. The first and second photoelectric conversion layers 40R and 42R may be spaced apart from each other. The silicon layer 50 may be formed between the first and second photoelectric conversion layers 40R and 42R that are vertically stacked. In some exemplary embodiments, the first photoelectric conversion layer 40R may have a thickness greater than a thickness of the second photoelectric conversion layer 42R. The first and second photoelectric conversion layers 40R and 42R may respectively include photoelectric conversion devices, for example, photodiodes (PD). Short wavelength components (for example, blue light B) of incident light (L(R+G+B)) may be absorbed near an upper surface of the silicon layer 50. Long wavelength components (for example, red light R) of incident light may be absorbed more as the light goes down from the upper surface of the silicon layer 50. Accordingly, the second photoelectric conversion layer 42R disposed near to the upper surface of the silicon layer 50 may be a photoelectric conversion device (for example, a photodiode) that performs a photoelectric conversion by absorbing blue light B. The first photoelectric conversion layer 40R that is disposed relatively away from the upper surface of the silicon layer 50 may be a photoelectric conversion device (for example, a photodiode) that performs a photoelectric conversion by absorbing red light R. A first micro-lens 44R is provided on the upper surface of the silicon layer 50 in the red light region 30R. The first micro-lens 44R is stacked above the second photoelectric conversion layer 42R. In some exemplary embodiments, the first micro-lens 44R may be stacked directly above the second photoelectric conversion layer 42R. Accordingly, the components of wavelengths of incident light L(R+G+B) may be focused in the first and second photoelectric conversion layers 40R and 42R by the first micro-lens 44R.

Third photoelectric conversion layer 40G and fourth photoelectric conversion layer 42G are sequentially stacked in the green light region 30G of the silicon layer 50. In some exemplary embodiments, the third photoelectric conversion layer 40G may have a thickness greater than a thickness of the fourth photoelectric conversion layer 42G. In some exemplary embodiments, the third photoelectric conversion layer 40G may have a same thickness as the first photoelectric conversion layer 40R. The third and fourth photoelectric conversion layers 40G and 42G may have a same arrangement relationship as the first and second photoelectric conversion layers 40R and 42R discussed above. Accordingly, the third photoelectric conversion layer 40G may include a photoelectric conversion device that performs a photoelectric conversion by absorbing a long wavelength component (for example, red light R) of incident light L(R+G+B). The fourth photoelectric conversion layer 42G may include a photoelectric conversion device that performs a photoelectric conversion by absorbing a short wavelength component (for example, blue light B) of incident light L(R+G+B). A second micro-lens 44G is provided on the upper surface of the silicon layer 50 in the green light region 30G. The second micro-lens 44G may form a micro-lens array together with the first micro-lens 44R. The second micro-lens 44G may be disposed above the fourth photoelectric conversion layer 42G. In some exemplary embodiments, the second microlens 44G may be disposed directly above the fourth photoelectric conversion layer 42G. Accordingly, the components of wavelengths of light L(R+G+B) incident through the second micro-lens 44G may be focused on the third and fourth photoelectric conversion layers 40G and 42G. A fifth photoelectric conversion layer 46 may be disposed on the first and second micro-lenses 44R and 44G. The first and second micro-lenses 44R and 44G may be covered by the fifth photoelectric conversion layer 46. In some exemplary embodiments, the fifth photoelectric conversion layer 46 may directly contact the first and second micro-lenses 44R and 44G. The fifth photoelectric conversion layer 46 may be formed of different material from the first through fourth photoelectric conversion layers 40R, 42R, 40G, and 42G. For example, the first through fourth photoelectric conversion layers 40R, 42R, 40G, and 42G may include photoelectric conversion devices based on silicon, but the fifth photoelectric conversion layer 46 may include a photoelectric conversion device based on non-silicon material. For example, the fifth photoelectric conversion layer 46 may include an organic photodiode (PD). The fifth photoelectric conversion layer 46 may perform photoelectric conversion by absorbing a component, for example, green light G of the incident light L(R+G+B). Since the fifth photoelectric conversion layer 46 is disposed on the first and second microlenses 44R and 44G, a component of the incident light L(R+G+B), for example, green light G is absorbed by the fifth photoelectric conversion layer 46, and the remaining components of the incident light L(R+G+B) enter into the first and second micro-lenses 44R and 44G.

The first and second photoelectric conversion layers 40R and 42R are disposed with different depths in the silicon layer 50, and the third and fourth photoelectric conversion layers 40G and 42G are disposed with different depths in the silicon layer 50, and thus, components of light absorbed in each of the first through fourth photoelectric conversion layers 40R, 42R, 40G, and 42G may be clearly separated. Accordingly, as a whole, most of the incident light L(R+G+B) is absorbed in photoelectric conversion layers, and thus, the color separation effect is increased. As a result, a light amount and resolution of an image is increased, and the degree of color purity is also increased. The first through fourth photoelectric conversion layers 40R, 42R, 40G, and 42G disposed below the first and second micro-lenses 44R and 44G may be referred to as lower photoelectric conversion layers, and the photoelectric conversion layer disposed above the first and second micro-lenses 44R and 44G may be referred to as an upper photoelectric conversion layer.

Figure 3:
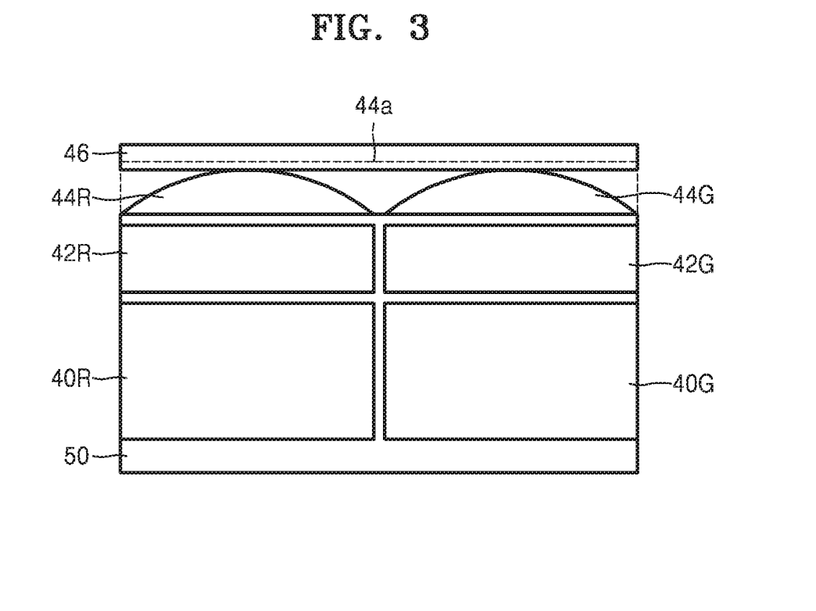
FIGS. 3 through 5 are cross-sectional views of embodied examples of the image sensor of FIG. 2.
Figure 4:
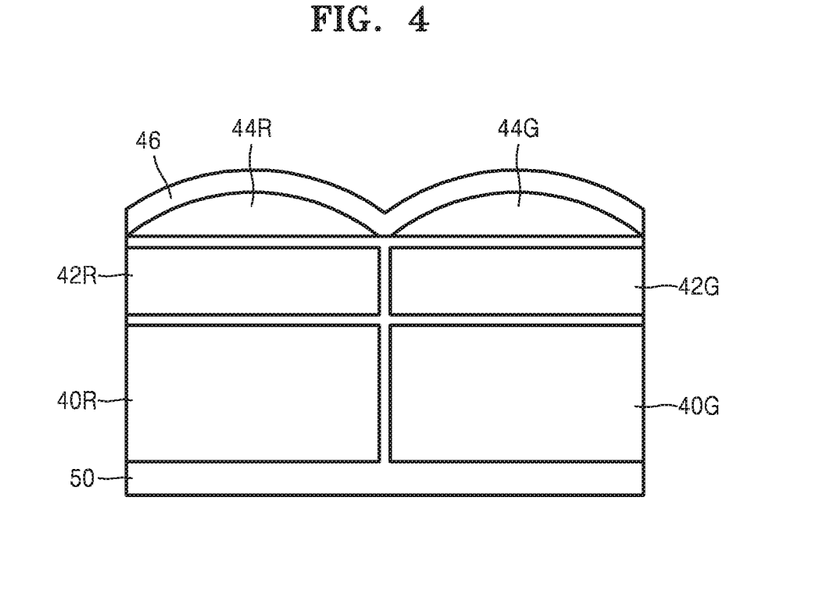
Figure 5:
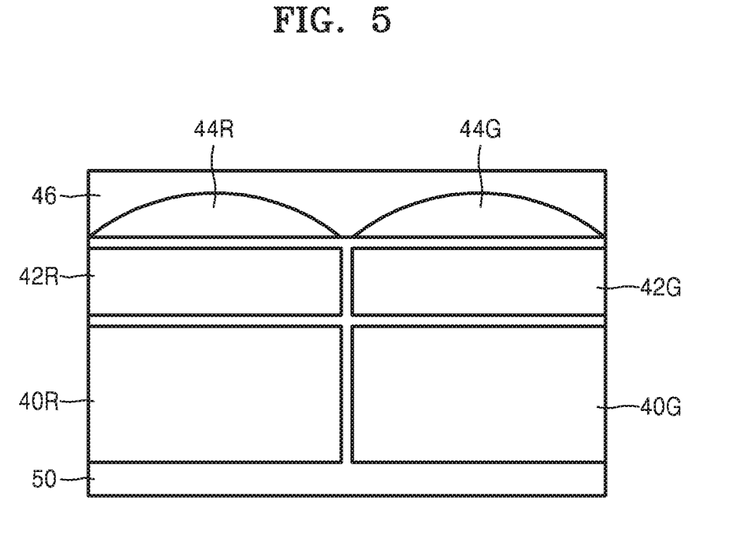

FIGS. 3 through 5 are cross-sectional views of further realized image sensors of the image sensor of FIG. 2, according to various exemplary embodiments.

Referring to FIG. 3, the first and second micro-lenses 44R and 44G formed on the upper surface of the silicon layer 50 may be semicircle convex lenses. A micro-lens array formed of such semicircle convex lenses may be formed between the upper surface of the silicon layer 50 and the fifth photoelectric conversion layer 46. Also, the fifth photoelectric conversion layer 46 may be disposed on the first and second micro-lenses 44R and 44G as a flat type photoelectric conversion layer. A bottom surface of the fifth photoelectric conversion layer 46 may contact apexes of the first and second micro-lenses 44R and 44G. As shown by a dotted line in FIG. 3, in some exemplary embodiments, the first and second micro-lenses 44R and 44G may be covered by a transparent material layer 44a, and the fifth photoelectric conversion layer 46 may be disposed on the transparent material layer 44a. In this case, the transparent material layer 44a may be a material layer that is a transparent to incident light and has a low optical absorption rate, and an upper surface thereof may be flat. That is, the transparent material layer 44a has a lower optical absorption rate than an absorption rate of the photoelectric conversion layers. In other exemplary embodiments, the transparent material layer 44a may be omitted.

In some exemplary embodiments, the fifth photoelectric conversion layer 46 may have a different configuration than a flat type. For example, as depicted in FIG. 4, the fifth photoelectric conversion layer 46 may be formed to have a convex shape to cover the whole convex surfaces of the first and second micro-lenses 44R and 44G. An upper surface of the fifth photoelectric conversion layer 46 may be a curved surface that has the same curvature as or a similar curvature to the first and second micro-lenses 44R and 44G. The fifth photoelectric conversion layer 46 having the curved surface may be formed by using a spin coating method.

Also, as depicted in FIG. 5, the fifth photoelectric conversion layer 46 may cover a whole surface of the first and second micro-lenses 44R and 44G. In this case, an upper surface of the fifth photoelectric conversion layer 46 may have a flat surface. The fifth photoelectric conversion layer 46 having a flat upper surface may be formed by forming a photoelectric conversion layer using a spin coating apparatus and then flattening the surface of the photoelectric conversion layer.

Figure 6:
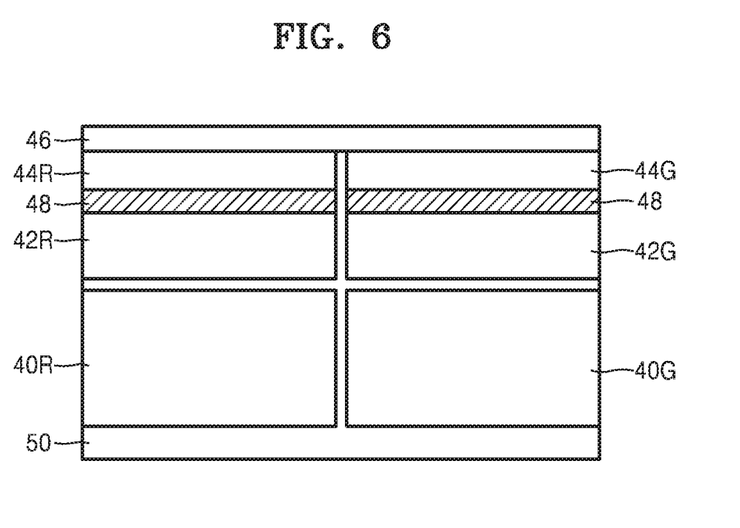
FIG. 6 is a cross-sectional view of a stacked image sensor according to another exemplary embodiment, wherein the cross-sectional view corresponds to the cross-sectional view taken along the line 2-2' of FIG. 1.

FIG. 6 is a cross-sectional view of a stacked image sensor according to another exemplary embodiment. The cross-sectional view of FIG. 6 shows another example of the cross-sectional view taken along the line 2-2' of FIG. 1. Parts different from the stacked image sensor of FIG. 2 will be described.

Referring to FIG. 6, a color filter 48 may be formed between the second photoelectric conversion layer 42R and the first micro-lens 44R. Also, the color filter 48 may be formed between the fourth photoelectric conversion layer 42G and the second micro-lens 44G. The color filter 48 may be an organic dye color filter. The color filter 48 may be a color filter that absorbs a same light as light that is absorbed by the fifth photoelectric conversion layer 46. For example, when the fifth photoelectric conversion layer 46 is a photoelectric conversion layer that performs a photoelectric conversion by absorbing green light G, the color filter 48 may be a filter that absorbs green light G of the incident light L(R+G+B) and transmits remaining light therethrough. Since the color filter 48 is provided, green light G that may remain in the light that has passed through the fifth photoelectric conversion layer 46 may be absorbed. Accordingly, in the light L(R+G+B) incident to the first and second photoelectric conversion layers 40R and 42R and the third and fourth photoelectric conversion layers 40G and 42G, the rate of blue light B and red light R may further be increased and most of the green light G may be removed. As a result, since the color filter 48 is provided, light components that are absorbed by the photoelectric conversion layers and converted to electrical energy may further be clearly separated and the degree of color purity may also be increased.

Figure 7:
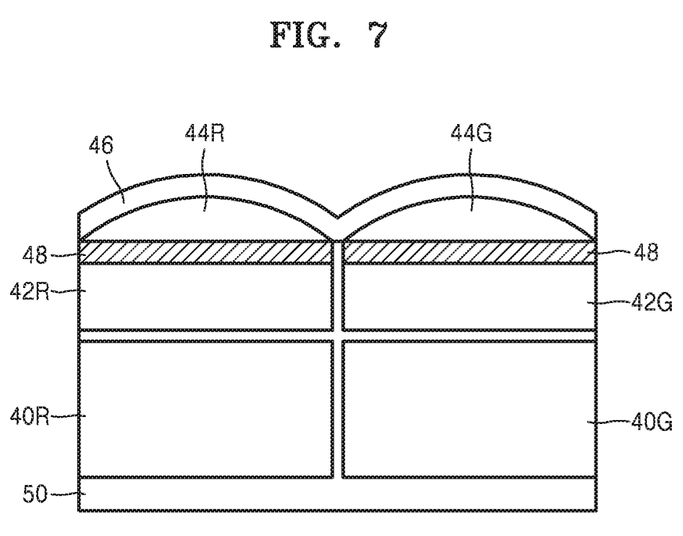
FIG. 7 is a cross-sectional view of the stacked image sensor of FIG. 4, to which a color filter is applied.

FIG. 7 is a cross-sectional view of the stacked image sensor of FIG. 4, to which the color filter 48 is applied.

Referring to FIG. 7, in some exemplary embodiments, the color filter 48 may directly contact the second photoelectric conversion layer 42R and the fourth photoelectric conversion layer 42G disposed thereunder, and also, may directly contact the first and second micro-lenses 44R and 44G disposed thereabove. The color filter 48 in the configuration shown in FIG. 7 may be applied also to the stacked image sensors of FIGS. 3 and 5.

Figure 8A:
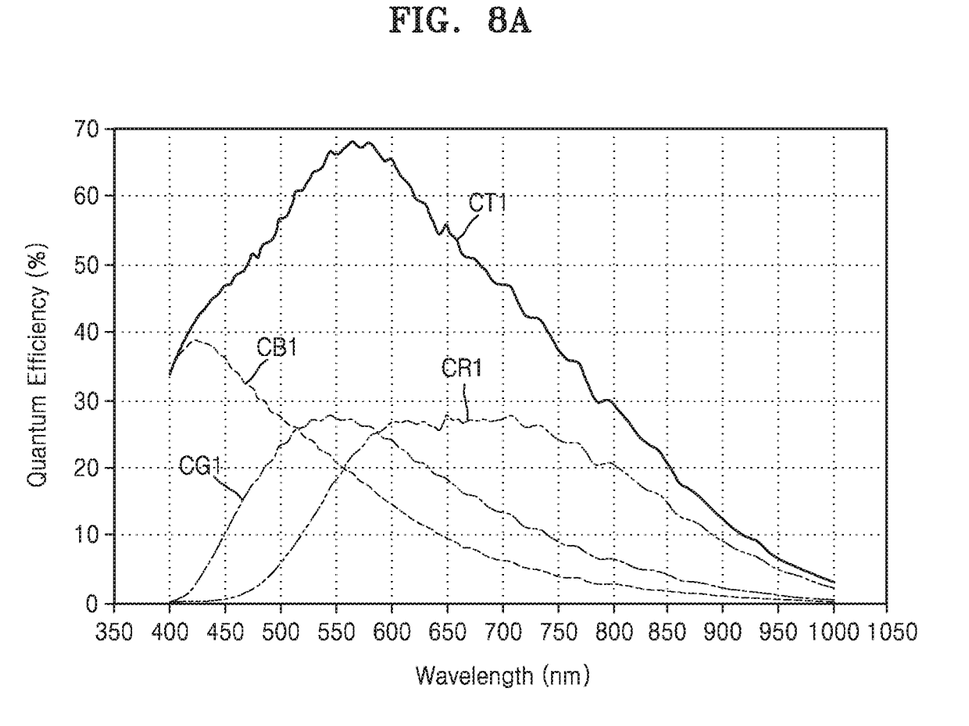
FIG. 8A is a color separation spectrum of a stacked image sensor of the related art to compare with the stacked image sensor according to an exemplary embodiment.
Figure 8B:
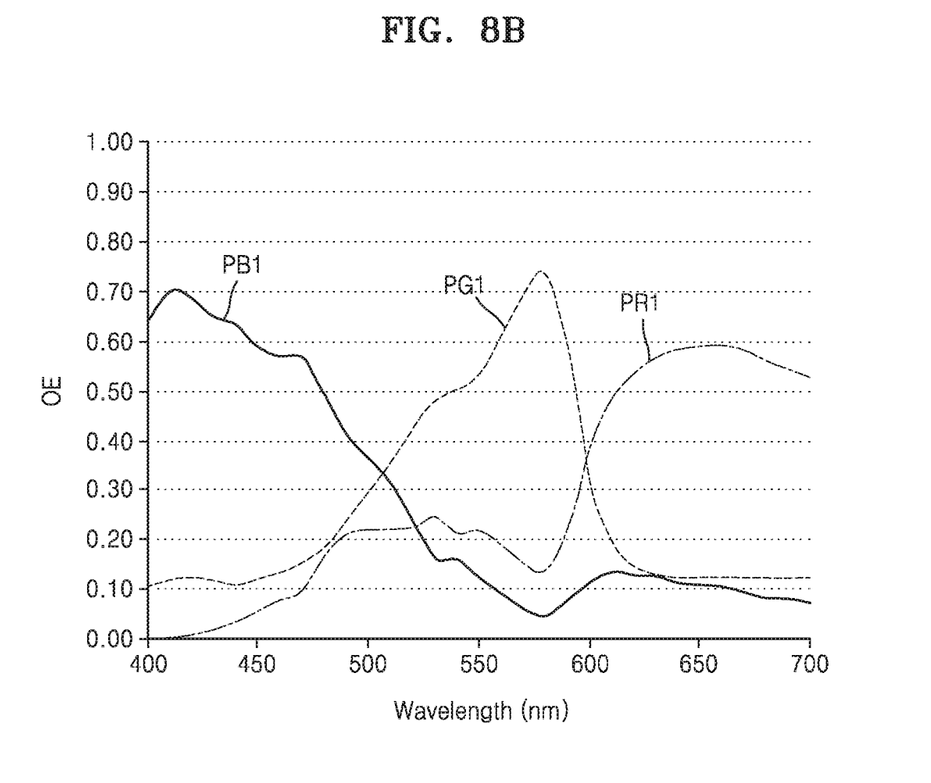
FIG. 8B is a graph showing a color separation spectrum of a stacked image sensor according to an exemplary embodiment.

FIG. 8A is a graph showing a color separation spectrum of a stacked image sensor of the related art to compare with the stacked image sensor according to an exemplary embodiment. FIG. 8B is a graph showing a color separation spectrum of a stacked image sensor according to an exemplary embodiment.

In FIGS. 8A and 8B, the horizontal axis indicates a wavelength of incident light, and a vertical axis indicates quantum efficiency.

The result of FIG. 8A is obtained by using a stacked image sensor in which the photoelectric conversion layers included in the stacked image sensor are all silicon photodiodes (PDs).

In FIG. 8A, a first graph CB1 shows a color separation spectrum (an optical absorption spectrum) of a photoelectric conversion layer that performs a photoelectric conversion by absorbing blue light B, and a second graph CG1 shows a color separation spectrum of a photoelectric conversion layer that performs a photoelectric conversion by absorbing green light G. A third graph CR1 shows a color separation spectrum of a photoelectric conversion layer that performs a photoelectric conversion by absorbing red light R, and the reference numeral CT1 shows a color separation spectrum of all the photoelectric conversion layers together.

Referring to FIG. 8A, in the case of the stacked image sensor of the related art, a large portion of color separation spectrum overlaps on a center of the color separation spectrum of each of the photoelectric conversion layers. This occurs because each of the photoelectric conversion layers absorbs a significant portion of light in a wavelength band adjacent to a central light in addition to the central light that is absorbed by each of the photoelectric conversion layers. Accordingly, in the case of a stacked image sensor having the result shown in FIG. 8A, the color separation effect is reduced, and as a result, the degree of color purity is reduced.

In FIG. 8B, a first graph PB1 shows a color separation spectrum of the third and fourth photoelectric conversion layers 40G and 42G that performs a photoelectric conversion by absorbing blue light B, and a second graph PG1 shows a color separation spectrum of the fifth photoelectric conversion layer 46 that performs a photoelectric conversion by absorbing green light G. A third graph PR1 shows a color separation spectrum of the first and second photoelectric conversion layers 40R and 42R that performs a photoelectric conversion by absorbing red light R.

Referring to FIG. 8B, the center portions of the color separation spectrum of each of the photoelectric conversion layers are clearly separated from each other. In consideration of this result, it is seen that the stacked image sensor according to the exemplary embodiment has a higher degree of color purity than that of the related art while absorbing a sufficient amount of light.

Figure 9:
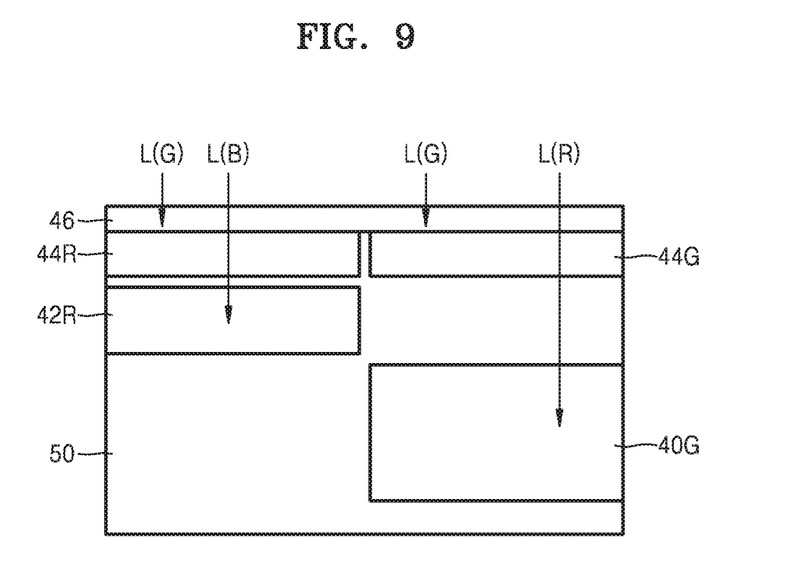
FIG. 9 is a cross-sectional view of a stacked image sensor according to another exemplary embodiment, wherein the cross-sectional view corresponds to the cross-sectional view taken along the line 2-2' of FIG. 1.

FIG. 9 is a cross-sectional view of a stacked image sensor according to another exemplary embodiment. The cross-sectional view of FIG. 9 is another example of the cross-sectional view taken along the line 2-2' of FIG. 1. Parts different from the stacked image sensor of FIG. 2 will be described.

Referring to FIG. 9, only one photoelectric conversion layer, for example, the second photoelectric conversion layer 42R is formed in the red light region 30R of the silicon layer 50, and also only one photoelectric conversion layer, for example, the third photoelectric conversion layer 40G is formed in the green light region 30G of the silicon layer 50. The remaining configuration may be the same as the configuration of the stacked image sensor of FIG. 2. In this manner, since the second photoelectric conversion layer 42R and the third photoelectric conversion layer 40G are respectively disposed in the red light region 30R and the green light region 30G of the silicon layer 50, the amount of optical absorption may be lower than in the case of the configuration shown in FIG. 2, but the color separation effect may further be increased, and thus, the degree of color purity may further be increased.

Figure 10:
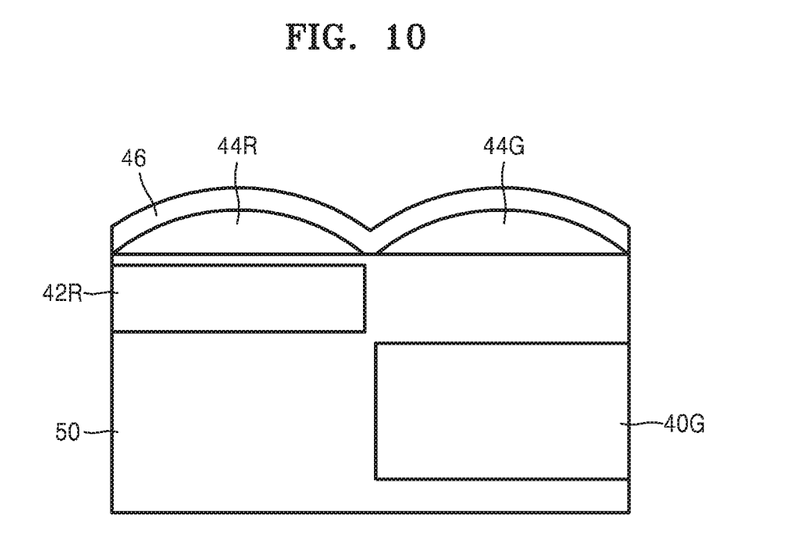
FIG. 10 is a cross-sectional view of the stacked image sensor of FIG. 4, to which a technical aspect of the image sensor of FIG. 9 is applied, according to an exemplary embodiment.

FIG. 10 is a cross-sectional view of the stacked image sensor of FIG. 4, to which a technical aspect of the image sensor of FIG. 9 is applied.

Figure 11:
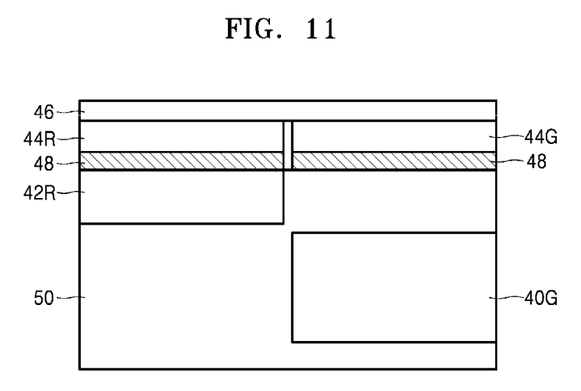
FIG. 11 is a cross-sectional view of the stacked image sensor of FIG. 6, to which a technical aspect of the image sensor of FIG. 9 is applied, according to an exemplary embodiment.
Figure 12:
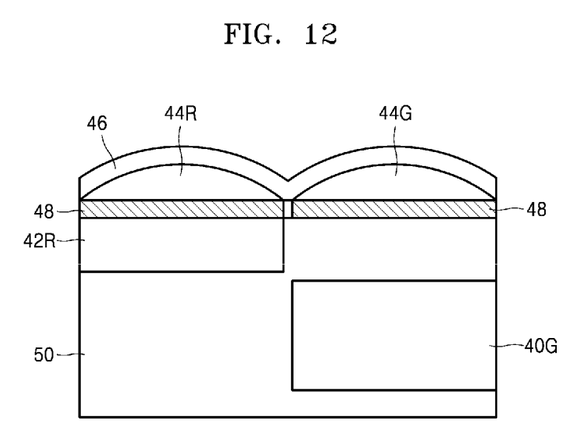
FIG. 12 is a cross-sectional view of the stacked image sensor of FIG. 7, to which a technical aspect of the image sensor of FIG. 9 is applied, according to an exemplary embodiment.

FIG. 11 is a cross-sectional view of the stacked image sensor of FIG. 6, to which a technical aspect of the image sensor of FIG. 9 is applied;

FIG. 12 is a cross-sectional view of the stacked image sensor of FIG. 7, to which a technical aspect of the image sensor of FIG. 9 is applied.

The arrangement of the vertically stacked photoelectric conversion layers in the blue light region 30B of FIG. 1 may be the same as or similar to the arrangement in the red light region 30R.

Next, a method of manufacturing a stacked image sensor according to an exemplary embodiment will be described with reference to FIGS. 13 to 16. Like reference numerals are used to indicate like elements, and the descriptions thereof will be omitted.

Figure 13:
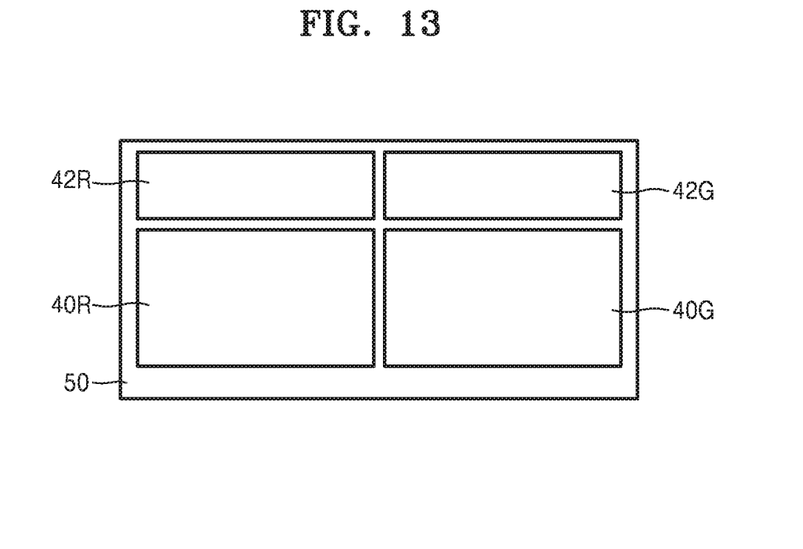
FIGS. 13 through 16 are cross-sectional views for explaining a method of manufacturing a stacked image sensor according to an exemplary embodiment.

Referring to FIG. 13, the first photoelectric conversion layer 40R and the third photoelectric conversion layer 40G are formed in the silicon layer 50. The first and third photoelectric conversion layers 40R and 40G may be formed close to a bottom of the silicon layer 50. The first and third photoelectric conversion layers 40R and 40G may be formed spaced apart from each other. The first photoelectric conversion layer 40R may be a photodiode layer and may be formed by injecting a p-type dopant and an n-type dopant by using an ion injection method. The third photoelectric conversion layer 40G may also be formed using the same method as the method used to form the first photoelectric conversion layer 40R. Next, the second photoelectric conversion layer 42R may be formed between the upper surface of the silicon layer 50 and the first photoelectric conversion layer 40R. The fourth photoelectric conversion layer 42G may be formed between the upper surface of the silicon layer 50 and the third photoelectric conversion layer 40G. The second and fourth photoelectric conversion layers 42R and 42G may be formed to have a thinner thickness than a thickness of the first and third photoelectric conversion layers 40R and 40G, respectively. The second and fourth photoelectric conversion layers 42R and 42G may be formed to be spaced apart from each other. Also, the second and fourth photoelectric conversion layers 42R and 42G may be spaced apart from the first and third photoelectric conversion layers 40R and 40G, respectively. The second and fourth photoelectric conversion layers 42R and 42G may be PD layers and may be formed by injecting a p-type dopant and an n-type dopant by using an ion injection method.

Figure 14:
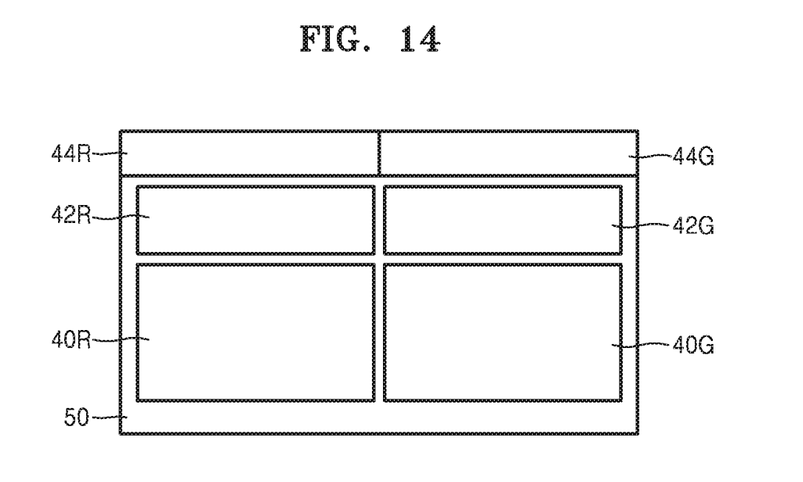

Next, as depicted in FIG. 14, the first and second micro-lenses 44R and 44G may be formed on the upper surface of the silicon layer 50. The first and second micro-lenses 44R and 44G may be a part of a micro-lens array. The first micro-lens 44R may be formed to be located directly above the second photoelectric conversion layer 42R. The second micro-lens 44G may be formed to be located directly above the fourth photoelectric conversion layer 42G.

Figure 15:
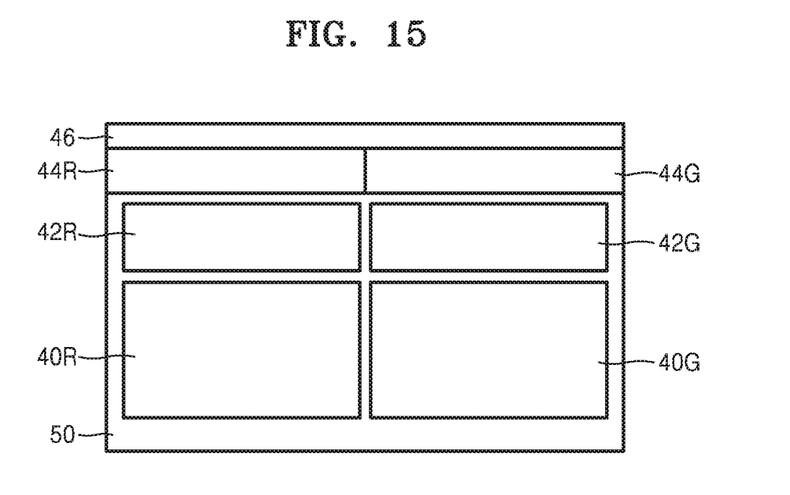

Next, as depicted in FIG. 15, the fifth photoelectric conversion layer 46 may be formed on the first and second micro-lenses 44R and 44G. The fifth photoelectric conversion layer 46 may be a different type of photoelectric conversion layer from the first through fourth photoelectric conversion layers 40R, 40G, 42R, and 42G. The fifth photoelectric conversion layer 46 may include an organic type PD. In some exemplary embodiments, the fifth photoelectric conversion layer 46 may be formed to directly contact the first and second micro-lenses 44R and 44G. However, in other exemplary embodiments, a transparent material layer 44a having a low optical absorption rate may further be formed between the fifth photoelectric conversion layer 46 and the first and second micro-lenses 44R and 44G.

Figure 16:
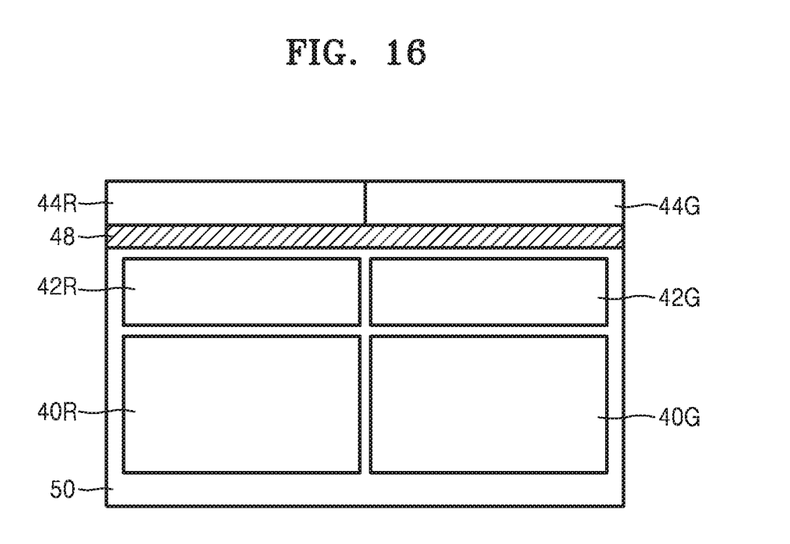

Also, in the method of manufacturing a stacked image sensor, as depicted in FIG. 16, the color filter 48 may further be formed between the first and second micro-lenses 44R and 44G, and the upper surface of the silicon layer 50. The color filter 48, as depicted in FIG. 16, may be formed on a whole upper surface of the silicon layer 50, or may be formed only on portions corresponding to the second and fourth photoelectric conversion layers 42R and 42G. Also, as depicted in FIG. 9, in some exemplary embodiments, some of the first through fourth photoelectric conversion layers 40R, 40G, 42R, and 42G may be omitted.

The stacked image sensor according to the exemplary embodiments has a structure in which different types of photoelectric conversion layers (or photoelectric conversion devices) are vertically stacked in a pixel. In an exemplary structure, an organic type photoelectric conversion layer, that is, an upper photoelectric conversion device, is formed on the top of the vertically stacked photoelectric conversion layers, and the upper photoelectric conversion layer performs a photoelectric conversion by absorbing one component of incident light, for example, green light G. One or two photoelectric conversion layers that are disposed below the upper photoelectric conversion layer and are different types of layers from the upper photoelectric conversion layer perform a photoelectric conversion by absorbing remaining portion of the incident light, for example, red light R or blue light B.

In this way, the components of light incident to the stacked image sensor are absorbed in the corresponding photoelectric conversion layers and are converted to electrical energy, and thus, the amount of absorbed light may be increased and the color separation effect may also be increased. Accordingly, a bright image may be obtained, the resolution of the image may be increased, and a degree of color purity may also be increased.

While one or more exemplary embodiments have been described with reference to the figures, it will be understood by those of ordinary skill in the art that various changes in form and details may be made therein without departing from the spirit and scope as defined by the following claims.

What is claimed is:

1. A stacked image sensor comprising:
    a lower photoelectric conversion layer provided in a silicon layer;
    a micro-lens provided on the lower photoelectric conversion layer; and
    an upper photoelectric conversion layer provided on the micro-lens,
    wherein the lower photoelectric conversion layer and the upper photoelectric conversion layer are different types of photoelectric conversion layers, and
    wherein the lower photoelectric conversion layer comprises two vertically stacked photoelectric conversion layers for each of a plurality of color regions included in a unit pixel of the stacked image sensor.

2. The stacked image sensor of claim 1, further comprising a color filter.

3. The stacked image sensor of claim 2, wherein the color filter is an organic dye type color filter that absorbs a same color of light as the upper photoelectric conversion layer.

4. The stacked image sensor of claim 1, wherein the upper photoelectric conversion layer is a flat type photoelectric conversion layer.

5. The stacked image sensor of claim 1, wherein the upper photoelectric conversion layer is a curved surface type photoelectric conversion layer.

6. The stacked image sensor of claim 1, further comprising a transparent material layer provided between the upper photoelectric conversion layer and the micro-lens, the transparent material layer having a low optical absorption rate.

7. The stacked image sensor of claim 1, wherein the upper photoelectric conversion layer is a non-silicon-based photoelectric conversion layer and the lower photoelectric conversion layer is a silicon-based photoelectric conversion layer.

8. The stacked image sensor of claim 1, wherein the upper photoelectric conversion layer comprises an organic photodiode.

9. The stacked image sensor of claim 1, wherein the upper photoelectric conversion layer is a photoelectric conversion layer that performs photoelectric conversion by absorbing green light.

10. The stacked image sensor of claim 1, wherein the two vertically stacked photoelectric conversion layers have different thicknesses from each other.

11. The stacked image sensor of claim 1, wherein the micro-lens is in direct contact with an upper surface of the silicon layer.

12. A method of manufacturing a stacked image sensor, the method comprising:

forming a lower photoelectric conversion layer in a silicon layer;

forming a micro-lens on the lower photoelectric conversion layer; and forming an upper photoelectric conversion layer on the micro-lens, wherein the lower photoelectric conversion layer and the upper photoelectric conversion layer are different types of photoelectric conversion layers, and wherein the forming of the lower photoelectric conversion layer comprises forming two vertically stacked photoelectric conversion layers in each of a plurality of color regions included in a unit pixel of the stacked image sensor.

13. The method of claim 12, wherein the upper photoelectric conversion layer is formed by using a method that is different than a method used to form the lower photoelectric conversion layer.

14. The method of claim 12, wherein the upper photoelectric conversion layer is a flat type photoelectric conversion layer or a curved surface type photoelectric conversion layer.

15. The method of claim 12, wherein the lower photoelectric conversion layer is a silicon-based photoelectric conversion layer and the upper photoelectric conversion layer is a non-silicon-based photoelectric conversion layer.

16. The method of claim 12, further comprising forming a color filter between the lower photoelectric conversion layer and the micro-lens.

17. The method of claim 12, wherein the upper photoelectric conversion layer comprises an organic photodiode.

* * * * *